(12) United States Patent
West et al.

(10) Patent No.: US 11,270,600 B2
(45) Date of Patent: Mar. 8, 2022

(54) METHOD AND DEVICE FOR PASSIVE DETECTION OF PHYSICAL EFFECTS

(71) Applicant: United States Department of Energy, Washington, DC (US)

(72) Inventors: Shawn M. West, West Mifflin, PA (US); Matthew R. Chilleo, North Huntingdon, PA (US); William T. Portser, Jeannette, PA (US)

(73) Assignee: UNITED STATES DEPARTMENT OF ENERGY, Washington, DC (US)

( * ) Notice: Subject to any disclaimer, the term of this patent is extended or adjusted under 35 U.S.C. 154(b) by 518 days.

(21) Appl. No.: 15/978,299

(22) Filed: May 14, 2018

(65) Prior Publication Data

US 2018/0336793 A1 Nov. 22, 2018

Related U.S. Application Data

(60) Provisional application No. 62/506,690, filed on May 16, 2017.

(51) Int. Cl.

| G09B 9/00 | (2006.01) |
| G01R 1/067 | (2006.01) |
| G06G 7/54 | (2006.01) |
| G01T 1/169 | (2006.01) |
| G01T 1/20 | (2006.01) |
| G01T 1/00 | (2006.01) |
| G09B 23/20 | (2006.01) |

(52) U.S. Cl.
CPC ........... *G09B 9/00* (2013.01); *G01R 1/06788* (2013.01); *G01T 1/00* (2013.01); *G01T 1/169* (2013.01); *G01T 1/20* (2013.01); *G06G 7/54* (2013.01); *G09B 23/20* (2013.01)

(58) Field of Classification Search
CPC ........ G09B 9/00; G01R 1/06788; G01T 1/00; G01T 1/169
See application file for complete search history.

(56) References Cited

U.S. PATENT DOCUMENTS

| 3,035,772 A * | 5/1962 | Hough .................... G09B 9/00 703/5 |
| 3,276,143 A * | 10/1966 | Jaquiss .................... G09B 9/00 434/218 |
| 3,826,867 A * | 7/1974 | Goodman ................ H01J 29/00 348/811 |
| 4,500,295 A * | 2/1985 | Insinger, III ............. G09B 9/00 324/202 |
| 5,413,482 A * | 5/1995 | Ward ...................... G09B 23/20 434/11 |

(Continued)

*Primary Examiner* — Thomas J Hong
*Assistant Examiner* — Sadaruz Zaman
(74) *Attorney, Agent, or Firm* — Robert T. Burns; Jonathan W. Parthum; Brian J. Lally

(57) ABSTRACT

Disclosed are systems and methods for simulating proximity detection of physical effects, the system including an external probe; a base unit associated with the external probe via a connector, the base unit comprising at least one processor coupled to the connector, the at least one processor configured to compute results based on an input received from the external probe; an input device; and a graphical display unit configured to display at least one of the computed results from the at least one processor and the input received from the input device and input received from the external probe.

15 Claims, 3 Drawing Sheets

(56) References Cited

U.S. PATENT DOCUMENTS

| | | | | |
|---|---|---|---|---|
| 5,722,835 A * | 3/1998 | Pike | | G01N 29/36 |
| | | | | 434/218 |
| 5,807,113 A * | 9/1998 | Groeber | | G09B 9/00 |
| | | | | 434/218 |
| 6,033,225 A * | 3/2000 | Pike | | G01N 29/36 |
| | | | | 434/218 |
| 2006/0049345 A1* | 3/2006 | Rao | | G01T 1/20 |
| | | | | 250/269.1 |
| 2006/0073447 A1* | 4/2006 | Bjork | | F41A 33/00 |
| | | | | 434/218 |
| 2009/0263771 A1* | 10/2009 | Darois | | G09B 9/00 |
| | | | | 434/218 |
| 2010/0010343 A1* | 1/2010 | Daghighian | | A61B 6/4057 |
| | | | | 600/436 |
| 2010/0086795 A1* | 4/2010 | Hirai | | G03B 42/02 |
| | | | | 428/480 |
| 2011/0121187 A1* | 5/2011 | Frank | | G01T 1/20 |
| | | | | 250/368 |
| 2011/0122994 A1* | 5/2011 | Grubsky | | G21K 1/025 |
| | | | | 378/62 |
| 2013/0168556 A1* | 7/2013 | Blackburn | | G01T 1/20 |
| | | | | 250/362 |
| 2013/0295538 A1* | 11/2013 | Ambrose | | G09B 9/00 |
| | | | | 434/218 |
| 2014/0295062 A1* | 10/2014 | Chiyoma | | G01T 1/20 |
| | | | | 427/74 |
| 2015/0014547 A1* | 1/2015 | Damm | | G01T 1/2002 |
| | | | | 250/367 |
| 2015/0041668 A1* | 2/2015 | Rosen | | G01J 1/42 |
| | | | | 250/395 |
| 2015/0129783 A1* | 5/2015 | Kondo | | G01T 1/20 |
| | | | | 250/588 |
| 2015/0348428 A1* | 12/2015 | Lerg | | G09B 5/02 |
| | | | | 434/365 |
| 2016/0041272 A1* | 2/2016 | Kondo | | H01L 31/02322 |
| | | | | 250/361 R |
| 2016/0170042 A1* | 6/2016 | Den | | G01T 1/2008 |
| | | | | 250/368 |
| 2017/0025265 A1* | 1/2017 | Verenchikov | | G01T 1/20 |
| 2017/0173262 A1* | 6/2017 | Veltz | | A61B 5/0022 |
| 2017/0212251 A1* | 7/2017 | Hadjioannou | | G01T 1/2985 |
| 2018/0336793 A1* | 11/2018 | West | | G01R 1/06788 |
| 2019/0004187 A1* | 1/2019 | Sahlholm | | G01T 1/20 |

* cited by examiner

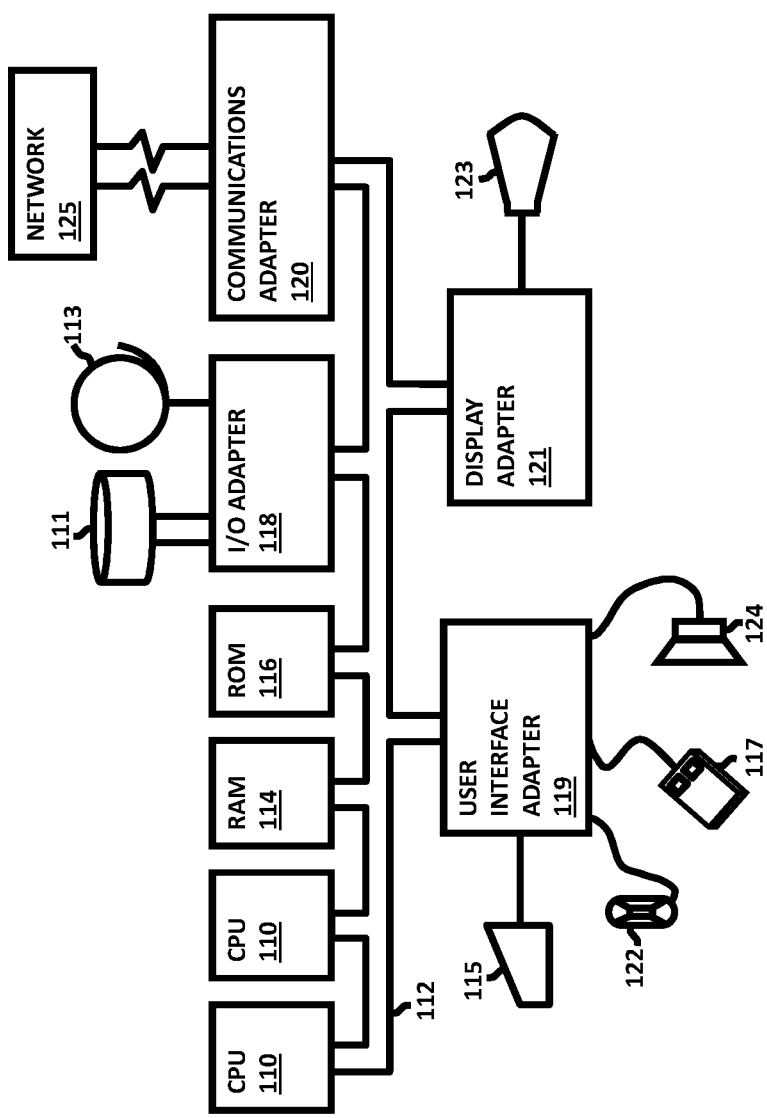

METHOD AND DEVICE FOR PASSIVE DETECTION OF PHYSICAL EFFECTS

FIELD

The present subject matter relates to passive optical detection, and more particularly, to electro-optical methods and devices for simulating proximity detection of physical effects.

BACKGROUND

Conventionally, training and detecting physical effects of interest, such as the field from radioactive sources, is a challenging and cumbersome process. Moreover, there is no existing passive technology that can be used for simulating proximity detection. For example, current training that uses simulated Radiation Detection, Indication, and Computation (RADIAC) technology employs a remote control unit that sends information using an RF transmitter to a receiver unit connected to a RADIAC device. The remote control unit sends a signal for the RADIAC device to display a normal background reading or an elevated reading. In other words, existing technology requires an instructor to remotely control the RADIAC's reading in order to simulate the detection of an active sample. Existing technology provides negative training for the student. For example, having the instructor inserted in the training scenario creates opportunities for incorrect training—such as when the instructor cannot see precisely when the student has the probe directly over the simulated contamination swipe or makes a mistake when triggering the training RADIAC device using the remote control. Additionally, it is common for a conventional training RADIAC device to display errors on the screen because of a communication error between the instructor's hand held remote and the RADIAC device or other faults. In such scenarios, Radiological Control (RadCon) trainers often have to resort to writing the reading on index cards and placing the index cards over the training RADIAC's screen to tell the student what is the simulated RADIAC reading.

Accordingly, since there is no existing passive technology that can be used for simulating proximity detection of physical effects, there are a number of challenges to overcome. For example, the existing technology does not provide a realistic experience for the user, does not truly follow the $1/r^2$ decay effect when detecting a simulated radioactive sample, cannot self-distinguish between simulated clean and contaminated samples or another object, and requires an instructor to be inserted in the training protocol and thus subject to the instructor's response and ability to observe if the probe attached to the RADIAC device is directly over the simulated contaminated sample. What is desired is passive technology that can be used for simulating proximity detection of various physical effects, while overcoming the challenges of the conventional technology.

SUMMARY

The following disclosure describes an electro-optical method for simulating proximity detection of physical effects such as a Radiation Detection, Indication, and Computation (RADIAC) device detecting radioactive material. Moreover, this disclosure describes a device that can optically detect passive targets based on fluorescing color and determine distance from a passive target. In general, the present disclosure describes methods and devices that detect radiating fields, radioactive material training, security detection (e.g., handheld explosive detectors for airport security) and to automated manufacturing. Additionally, the following description discloses simulating the behavior of a RADIAC detecting clean and radioactive samples.

In one exemplary aspect of the foregoing disclosure, a simulated Radiation Detection, Indication, and Computation (RADIAC) device is described that comprises: at least one processor that analyzes data and controls a graphics display, a graphics display that presents information to a user, tactile controls to interact with the device, a power source, and a connector that connects an external probe to the RADIAC device.

Another exemplary aspect of the foregoing disclosure includes a simulated RADIAC probe that comprises a magnetic sensor for detecting presence of a magnetic field, multiple optical stimulus devices for emitting light, an optical detector for detecting light, and a housing that contains a handle for the user.

Yet another exemplary aspect of the foregoing disclosure includes a simulated source check module that comprises: a housing that accepts the probe described above, a permanent magnet for providing a magnetic field for probe insertion detection, and a simulated contamination sample to replicate the proper reading as the probe is inserted into the housing.

Another exemplary aspect of the foregoing disclosure includes method of simulating radiation by using stimulated fluorescent material.

BRIEF DESCRIPTION OF THE DRAWINGS

The accompanying figures illustrate several embodiments and, together with the description, serve to explain the principles of the present subject matter. One of ordinary skill in the art readily recognizes that the embodiments illustrated in the figures are merely exemplary, and are not intended to limit the scope of the present subject matter.

FIG. 3 illustrates a schematic diagram of an exemplary computer architecture used in accordance with embodiments described herein.

DETAILED DESCRIPTION

The present disclosure relates to passive optical detection methods and devices, and to electro-optical methods and devices for simulating proximity detection of physical effects, such as the field from radioactive sources. The following description is presented to enable one of ordinary skill in the art to make and use the present subject matter and is provided in the context of a patent application and its requirements. Various modifications to the preferred embodiment and the generic principles and features described herein will be readily apparent to those skilled in the art including replacing elements from one embodiment with an element or elements from other embodiments unless specifically restricted. Thus, the present disclosure is not intended to be limited to the embodiments shown but is to be accorded the widest scope consistent with the principles and features described herein.

The present disclosure overcomes the aforementioned limitations of the existing technology and enables many more opportunities (including training opportunities), that were not available with the conventional technology. As described in further detail below, certain embodiments of the present disclosure use an optical sensor and a stimulator that resides in the simulated device (e.g., see FIG. 1) and passive items being detected (e.g., RadCon swipe). As used herein, a swipe may include the act of rubbing a pad on an area to transfer contamination from the area to the pad. Additionally, a swipe may also refer to the pad itself. However, the term "swipe" (e.g., RadCon swipe) is not limited to such examples.

Figure 1:
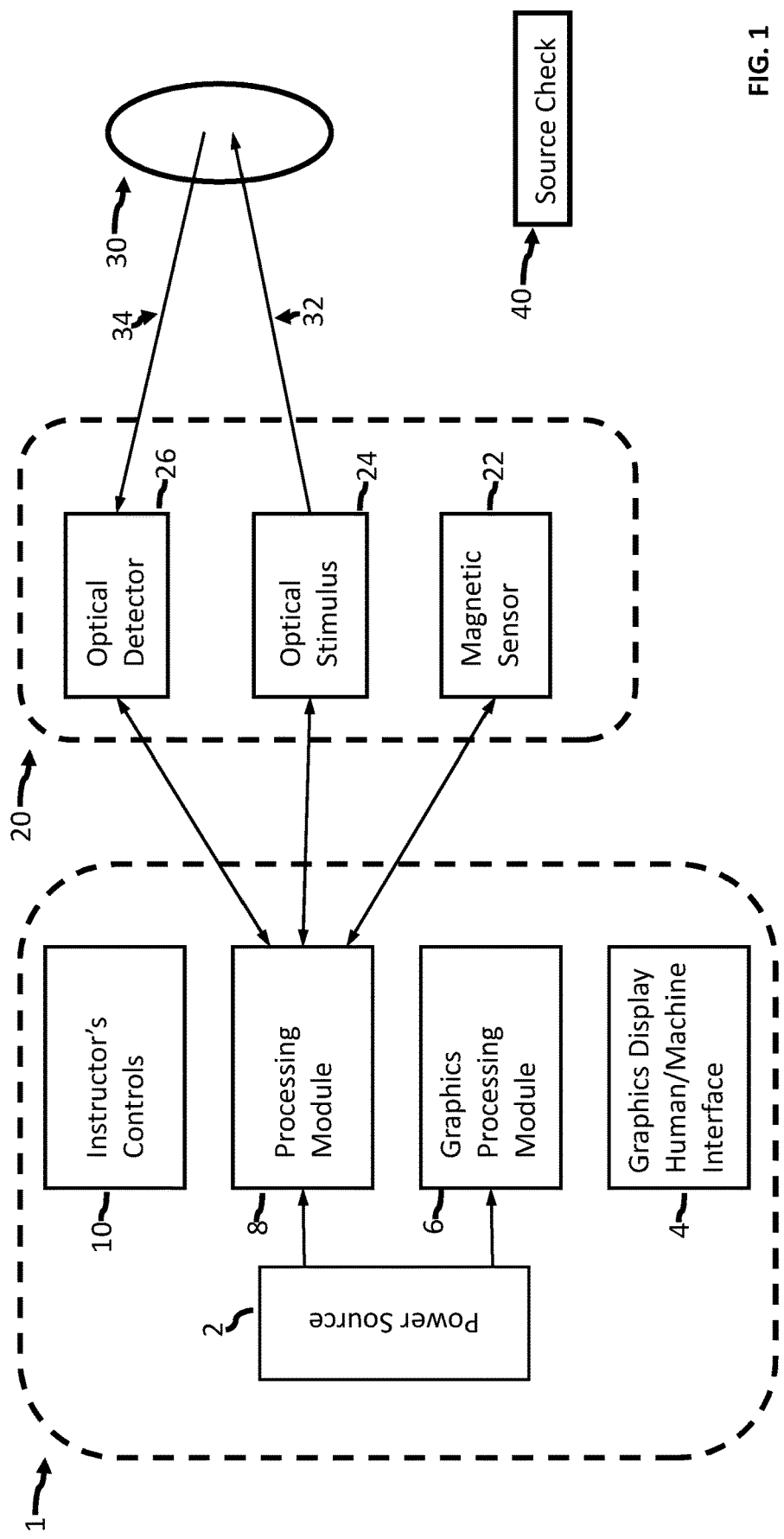
FIG. 1 illustrates block diagram of a simulated RADIAC device in accordance with an exemplary embodiment described herein.

FIG. 1 illustrates block diagram of a simulated RADIAC device in accordance with an embodiment described herein. As shown in FIG. 1, the simulated RADIAC device includes RADIAC base 1 and RADIAC probe 20. In certain exemplary embodiments, at least one of the probe 20 and/or the base 1 is sized for handheld use. As shown in FIG. 1, RADIAC base 1 includes Graphics Display Human/Machine Interface 4 (which may include a Graphic Display, not shown), Graphics Processing Module 6, Processing Module 8 and Instructor's Controls 10, whereas RADIAC probe 20 includes Magnetic Sensor 22, Optical Stimulus 24 and Optical Detector 26. In one embodiment, Optical Stimulus 24 sends out an optical pulse (pulse 32) that strikes Target 30. Pulse 32 may include any form of electromagnetic radiation in single or multiple wavelengths; for example, pulse 32 includes transmission in the ultraviolet (UV) optical range (i.e., electromagnetic radiation with a wavelength from 100 nm to 400 nm). In the embodiment shown in FIG. 1, the transmitted optical pulse (e.g., pulse 32, which may include a single wavelength or may include multiple wavelengths) hits passive targets (e.g., Target 30), which are coated with invisible paints that fluoresce in different wavelengths of light, in this embodiment, green, red, or optionally infrared light when illuminated with UV light (not shown in FIG. 1). Optical Detector 26 detects the different wavelengths of green, red, and/or infrared light (e.g., light 34) from the passive targets (e.g., Target 30) and the intensity of the light, as a whole and/or optionally separated by wavelength. Accordingly, one benefit of the present disclosure over conventional technology is that the detected intensity of the light 34, as received by the Optical Detector 26, falls as $1/r^2$, and as such provides a measure of proximity. In these exemplary embodiments, the intensity of light and radiation flux density provides a detection of proximity since they are dependent on the radius of a sphere and the surface area of a sphere.

As shown in FIG. 1, RADIAC base 1, via Processing Module 8, may convert the detected proximity to calculated sample counts for simulated RADIAC device. Processing Module 8 may also control the operation of the Optical Stimulus 24 and reads in the optical information from the Optical Detector 26. Processing Module 8 may further determine the type of fluorescent media (described below) being used during, for example, training exercises (e.g., green, red, or infrared fluorescent media) and may also calculate separation distance between Optical Detector 26 and the fluorescent media (e.g., that may be applied to Target 30). According to one example, for the simulated RADIAC, the color of the fluoresced light (e.g., green, red, or infrared) may be used to represent the type or level of simulated contamination and the optical intensity detected Optical Detector 26 may be used to calculate, by Processing Module 8, the distance to a detected fluorescent media. Is so doing, RADIAC base 1 and RADIAC Probe 20 effectively model the $1/r^2$ behavior that matches the actual response of a real RADIAC. In addition, Processing Module 8 may also communicate information to another device or a human machine interface such as a display screen (e.g., Graphics Display Human/Machine Interface 4). Processing Module 8 may further interface with a discrete detector (e.g., Magnetic Sensor 22 for the simulated RADIAC) to simulate a source check identification.

Furthermore, Processing Module 8 may compare the color spectrum and color temperature, including blackbody temperature or lamp color temperature as measured in Kelvin and/or Celsius (detected, for example, by Optical Detector 26), with and without the stimulus UV optical pulse (e.g., pulse 32) to discriminate the authenticity of the sample (e.g., Target 30) versus other fluorescent material, and/or to determine range from the sample. Moreover, according to certain embodiments, the pigment(s) from the paint can be mixed with petroleum jelly to provide a coating for simulated contaminated surfaces that can be transferred to swipes (e.g., RadCon swipes used during swiping to enhance the fidelity of training).

As described above, Optical Stimulus 24 provides a stimulus for the fluorescent media and may include an infrared light emitter, visible light emitter, and/or an ultraviolet light emitter. Optical Stimulus 24, however, is not limited to such examples, and one of ordinary skill in the art will readily recognize that there could be variations to the adaptive correction factor and those variations would be within the spirit and scope of the present disclosure.

Additionally, as described above and shown in FIG. 1, Optical Detector 26 may be used to identify the fluorescent light emitted from a fluorescent media. In addition, Optical Detector 26 may provide information such as color temperature, infrared light intensity, red light intensity, green light intensity, blue light intensity, and overall brightness. Optical Detector 26, however, is not limited to such examples, and one of ordinary skill in the art will readily recognize that there could be variations to the adaptive correction factor and those variations would be within the spirit and scope of the present disclosure.

FIG. 1 also includes Source Check Module 40. Source Check Module 40 may be used as a source check during a training exercise. For example, during a source check of a probe (e.g., RADIAC probe 20) may be placed onto a known source (Source Check Module 40) to verify calibration and operation of a RADIAC device. Source Check Module 40 may include an internal magnet (not shown), which magnetically interfaces with a magnetic sensor (e.g., Magnetic Sensor 22) on a probe (RADIAC Probe 20) to direct the RADIAC (via RADIAC base 1) to add a predetermined amount of counts to the background reading, where the background reading may be displayed via Graphics Display 4.

Moreover, a discrete detector (e.g., Magnetic Sensor 22) may be used to place RADIAC Base 1 in a certain mode of operation. For example, this may be accomplished by the use of a magnet (e.g., within Source Check Module 40, not shown and described in further detail below) and a magnetic sensor (e.g., Magnetic Sensor 22) or other go/no go technologies that are interfaced with the processing module. For example, a simulated RADIAC may utilize a permanent magnet within the simulated source check module (e.g., Source Check Module 40) and a magnetic field sensor (e.g., Magnetic Sensor 22) near an optical detector (e.g., Optical Detector 26) in the simulated probe (e.g., RADIAC Probe 20). For example, when Processing Module 8 determines that Magnetic Sensor 22 detected a predetermined polarity magnetic field above a certain level, Processing Module 8 may add a predetermined number of simulated counts to a simulated background level to simulate a source check with an actual RADIAC's probe.

While not shown in FIG. 1, Graphics Display Human/Machine Interface 4 may include various control buttons and a screen. According to one embodiment, the various control buttons provide Instructor's Controls 10. Instructor's Controls 10 may be configured to adjust and control a training scenarios in a training environment in certain embodiments. Moreover, according to certain embodiments, RADIAC Base 1 mimics the button configuration and speaker function of a Multi-Function RADIAC (MFR). For example, Graphics Display Human/Machine Interface 4 may include a screen on RADIAC Base 1 that replicates the functionality of an MFR. The screen may be any type of screen known in the art, though in some embodiments the screen may be an LCD screen. Moreover, the form factor for RADIAC Base 1 may be similar in size to a handheld device, such as an MFR device.

In the embodiment shown in FIG. 1, RADIAC Base 1 includes at least two processing modules—e.g., Graphics Processing Module 6 and Processing Module 8. According to certain embodiments described herein, the processing modules may include simple, low-cost processors—including, but not limited to Arduino® processors. As shown in FIG. 1, one processor (e.g., Processing Module 8) interfaces with RADIAC probe 20, performs the analysis for detection, and provides sounds (button pressing tones and detection clicks). While not shown in FIG. 1, the other processor (e.g., Graphics Processing Module 6) may provide sample averaging and controls to the display (not shown) that is part of Graphics Display Human/Machine Interface 4. While not shown in FIG. 1, the two processors may communicate with the other elements and/or each other through a data link.

RADIAC Probe 20, shown in FIG. 1, includes a discrete Magnetic Detector 22 and Optical Detector 26 (only a single optical stimulus device 24 is shown in FIG. 1). RADIAC Probe 20 may include one or multiple optical stimulus devices 24. In some embodiments, RADIAC Probe 20 optionally includes an optical color detector (not shown). The optical color detector detects the amount of red, green, blue, and white light present. In certain exemplary embodiments, detected wavelengths in place or and/or in addition to red, green, blue, and white may also be detected. Additionally, RADIAC Probe 20 may include an infrared sensor for detecting infrared fluorescent simulated contamination. In addition, RADIAC Probe 20 may include at least one light source, such as an ultraviolet LED, used to provide a UV pulse where the UV pulse is used to provide an optical stimulus for detection. Accordingly, the optical stimulus (e.g., provided by the ultraviolet LED) is dependent on the selected fluorescent material (described in further detail below). Magnetic Detector 22 may be used to detect a discrete input, such as the presence of a magnetic field, embedded in a source check module (e.g., Source Check Module 40) that indicates when a source check is being performed.

In certain exemplary methods, RADIAC Probe 20 may be placed on or near Source Check Module 40. For example, when RADIAC Probe 20 is placed on or near Source Check Module 40, the resulting device operates to simulate a source check function. Additionally, a RadCon swipe, painted with a fluorescent material (such as fluorescent paint), may be located at or near Source Check Module 40 to provide a realistic $1/r^2$ effect. Source Check Module 40 may also contain a magnet mounted inside to magnetically couple to Magnetic Detector 22 located inside RADIAC Probe 20 to indicate to the simulated RADIAC that a source check is being performed.

In the examples described above, various fluorescent materials alone or in combination may be used. For example, the fluorescent material may include an invisible non-toxic paint that fluoresces a particular color (e.g., green) when illuminated by ultraviolet light. Additional fluorescent materials may include pigments of other colors. Accordingly, such pigment may be mixed with other non-fluorescent materials, such as a petroleum jelly or other non-drying binders. Such combinations provide, for example, a method to apply the fluorescent material (e.g., the pigment) without drying for a time efficient simulation and to permit, in a training environment, transfer of the fluorescent material (e.g., the pigment) to a swipe. Moreover, different fluorescing colors (e.g., red vs. green) may be used to provide different level of simulated contamination.

Figure 2:
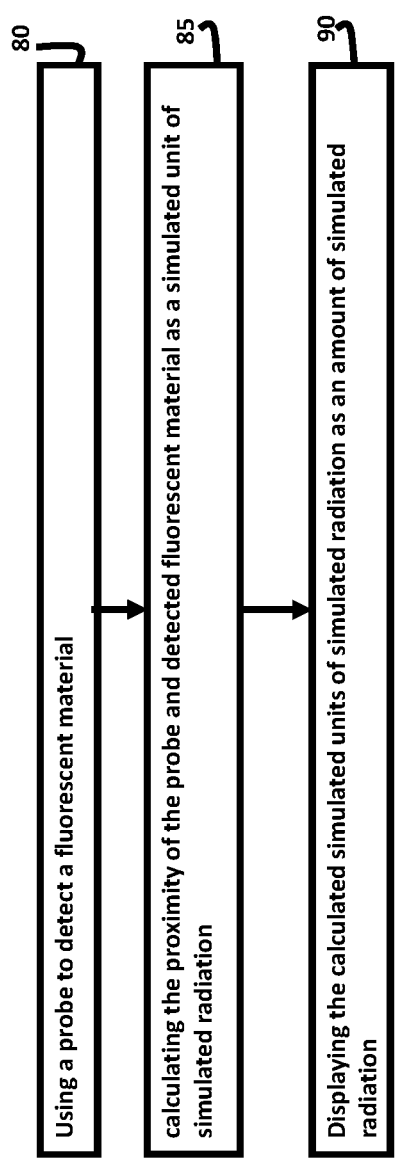
FIG. 2 is a flow diagram illustrating a method in accordance with an exemplary embodiment described herein.

FIG. 2 is a flow diagram illustrating a method in accordance with an exemplary embodiment described herein. As shown in FIG. 2, step 80 includes using a probe to detect a fluorescent material. Step 85 includes calculating the proximity of the probe and detected fluorescent material as a simulated unit of simulated radiation, and step 90 includes displaying the calculated simulated units of simulated radiation as an amount of simulated radiation.

The techniques provided by the embodiments herein may be implemented on an integrated circuit chip (not shown). The chip design may be according to known techniques created in a graphical computer programming language, and may be stored in any computer storage medium known in the art (such as a disk, tape, physical hard drive, or virtual hard drive such as in a storage access network). The designer may fabricate chips or the photolithographic masks used to fabricate chips. If the designer does not fabricate chips or the photolithographic masks used to fabricate chips, the designer may transmit the resulting design by physical means (e.g., by providing a copy of the storage medium storing the design) or electronically (e.g., through the Internet) to the chip or photolithographic mask-making entities, directly or indirectly. The stored design is then converted into an appropriate format (e.g., GDSII) for the fabrication of photolithographic masks, which typically includes multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In certain embodiments the chip is integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

What has been disclosed herein may comprise hardware and software elements, wherein when the above disclosure is implemented in software, the software may include but is not limited to, firmware, resident software, microcode, etc. Furthermore, the embodiments herein can take the form of a non-transitory computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The computer readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code is retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, Ethernet cards and wireless network interface controllers for WiFi are just a few of the currently available types of network adapters.

A representative hardware environment for practicing the disclosure described herein is depicted in FIG. 3. This schematic drawing illustrates a hardware configuration of an information handling/computer system in accordance with the embodiments herein. The system comprises at least one processor or central processing unit (CPU) 110. The CPUs 110 are interconnected via system bus 112 to various devices such as a random access memory (RAM) 114, read-only memory (ROM) 116, and an input/output (I/O) adapter 118. The I/O adapter 118 can connect to peripheral devices, such as disk units 111 and tape drives 113, or other program storage devices that are readable by the system. The system can read the inventive instructions on the program storage devices and follow these instructions to execute the methodology of the embodiments herein. Certain exemplary embodiments include one or more of a user interface adapter 119 that connects a keyboard 115, mouse 117, speaker 124, microphone 122, and/or other user interface devices such as a touch screen device (not shown) to the bus 112 to gather user input. In certain embodiments, a communication adapter 120 connects the bus 112 to a data processing network 125, and a display adapter 121 connects the bus 112 to a display device 123 which may be embodied as an output device such as a monitor, printer, or transmitter, for example.

The advantages of the present disclosure (e.g., RADIAC base 1, RADIAC probe 20 and Source Check Module 40, shown in FIG. 1) include: simulating the $1/r^2$ decay effect of radiation, light, and magnetism; using a passive target (e.g., Target 30) that does not require any power; the passive target (e.g., Target 30) may use a non-toxic coating or pigment to provide detection; pigments from non-toxic paint, used in detection, can be mixed with petroleum jelly or other clear carrier to provide enhanced training and simulation by replicating contamination transfer; simulation of various calibration functions (such as RadCon source check); and can adjusted for different background and elevated radiation levels.

Moreover, the present disclosure, when applied to a simulated RADIAC (e.g., RADIAC Base 1 and RADIAC Probe 20), allows someone to swipe an area, take a reading, cleanup the simulated contamination, and re swipe to determine if the area is clean. Under such a simulated environment, if the simulated contamination is not properly cleaned up, the residual simulated contamination will again be transferred to the swipe and read by the simulated RADIAC. Contrary to conventional technology, this sequence of actions is a benefit of the present disclosure and matches reality. Moreover, this sequence can be performed without any instructor intervention. Conventional training RADIACs cannot provide this realistic training.

Other benefits of present disclosure include improvements in manufacturing. For example, automatic assembly processes may be tracked at various stages of production by marking a product with a fluorescent media during a stage of production and using an optical detector (e.g., Optical Detector 26), a processing module (Processing Module 8), etc. to provide feedback to the automated controller (not shown in FIG. 1) status. The range detectability benefits described above may also be used to verify assembly line mechanical tolerances, and to automatically determine if these mechanical tolerances or clearances have changed and assembly line maintenance is required. The benefits of the present disclosure to manufacturing, however, are not limited to such examples, and one of ordinary skill in the art will readily recognize that there could be variations to the adaptive correction factor and those variations would be within the spirit and scope of the present disclosure.

Yet other benefits of the present disclosure include improvements in security device training. For example, many airports include, as part of overall security, the use of explosive detection devices (e.g., sniffers). Training exercises may include swabbing a person's hands with a paper or cloth material that is inserted into a simulated device that "smells" prohibited materials. Improvements in security device training may include a fluorescent media, as described above, applied to a person's hands and transferred to the paper or cloth during swabbing. When the swab is inserted into the simulated "sniffer", the simulated "sniffer" may detect similar stimulus using an optical detector (e.g., Optical Detector 26) described above.

Although the present subject matter has been described in accordance with the embodiments shown, one of ordinary skill in the art will readily recognize that there could be variations to the embodiments and those variations would be within the spirit and scope of the present subject matter. Accordingly, many modifications may be made by one of ordinary skill in the art without departing from the spirit and scope of the appended claims.

Moreover, the foregoing disclosure will so fully reveal the general nature of various embodiments that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A system for simulating proximity detection of physical effects, the system comprising:
   a simulated contamination sample coated with a fluorescent material mixed with a non-drying petroleum jelly for simulating proximity detection of physical effects;
   an external prole; and
   a base unit associated with the external probe via a connector, the base unit comprising;
      at least one processor configured to compute results based on an input received from the external probe; and
      a graphical display unit configured to display at least one of the computed results from the at least one processor and the input received from the external probe,
   wherein the external probe comprises:
      a magnetic sensor;
      at least one optical stimulus device; and
      an optical detector configured to detect an optical pulse that strikes the simulated contamination sample.

2. The system of claim 1; further comprising a power source coupled to the at least one processor and graphical display unit.

3. The system of claim 1, Wherein at least one of the external probe and base unit is sized for handheld use.

4. The system of claim 1, wherein
   at least one optical stimulus device is selected from a group consisting of at least one of UV LEDs, infrared LEDs and visible light LEDs; and
   the optical detector is selected from a group consisting of at least one of an infrared sensor, an UV sensor and a visible light sensor.

5. The system of claim 1, wherein the optical detector is configured to detect a non-toxic fluorescent pigment mixed with a non-drying petroleum jelly.

6. The system of claim 1, further comprising a passive target configured to operate without power.

7. A method of simulating radiation, comprising:
   using, a simulated contamination sample coated with a fluorescent material mixed with a non-drying petroleum jelly for simulating proximity detection of physical effects;
   using a probe to detect a fluorescent material;
   calculating a proximity of the probe and detected fluorescent material as a simulated unit of simulated radiation; and
   displaying the calculated simulated unit of simulated radiation as an amount of simulated radiation;
   wherein the probe comprises:
      a magnetic sensor;
      at least one optical stimulus device; and
      an optical detector configured to detect an optical pulse that strikes the simulated contamination sample.

8. The method of claim 7, Wherein the probe detects at least one of fluorescing LI V light, fluorescing infrared light and fluorescing visible light.

9. The method of claim 7, further comprising moving the probe in a sweeping motion.

10. The method of claim 7, wherein calculating the simulated unit of simulated radiation simulates $1/r^2$ dispersion effect.

11. The method of claim 7, further comprising detecting a passive target using the fluorescent material, wherein the passive target does not require any power.

12. A simulated source check module, comprising:
   a housing configured to accept an external probe;
   a permanent magnet coupled to the housing and emitting a magnetic field for probe insertion detection, and
   a simulated contamination sample coated with a fluorescent material mixed with a non-drying petroleum jelly for simulating proximity detection of physical effects within the housing,
   wherein the external probe comprises:
      a magnetic sensor;
      at least one optical stimulus device; and
      an optical detector configured to detect an optical pulse that strikes a physical target having the simulated contamination sample.

13. The simulated source check nodule of claim 12, wherein the simulated contamination sample replicates a simulated reading as the external probe is inserted into the housing.

14. The simulated source check module of claim 13, wherein the external probe is configured to be calibrated by inserting the external probe into the housing of the simulated source check nodule.

15. An apparatus for simulating proximity detection of physical effects, the apparatus comprising:
   a simulated contamination sample coated with a fluorescent material mixed with a non-drying petroleum jelly for simulating detection of physical effects;
   a probe;
   at least one processor coupled to the probe, the at least one processor computing results based on input received from the probe;
   a graphical display unit configured to display at least one of the computing results from the at least one processor and probe; and
   a power source coupled to the at least one processor and graphical display unit,
   wherein the probe comprises:
      a magnetic sensor;
      at least one optical stimulus device; and
      an optical detector configured to detect an optical pulse that strikes the simulated contamination sample.

* * * * *